United States Patent
Tsuchiya

(10) Patent No.: US 7,791,083 B2
(45) Date of Patent: Sep. 7, 2010

(54) LIGHT-EMITTING DIODE

(75) Inventor: Kosuke Tsuchiya, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 17 days.

(21) Appl. No.: 12/372,892

(22) Filed: Feb. 18, 2009

(65) Prior Publication Data
US 2009/0206356 A1    Aug. 20, 2009

(30) Foreign Application Priority Data
Feb. 18, 2008    (JP) .............................. 2008-036198

(51) Int. Cl.
*H01L 27/15*    (2006.01)
*H01L 31/12*    (2006.01)
*H01L 33/00*    (2006.01)

(52) U.S. Cl. .............................. 257/79; 257/98; 257/99; 349/62; 445/24; 445/25

(58) Field of Classification Search .................. 257/79, 257/98, 99, E33.062
See application file for complete search history.

(56) References Cited

U.S. PATENT DOCUMENTS

| | | | | |
|---|---|---|---|---|
| 6,869,813 B2 * | 3/2005 | Okazaki | | 438/22 |
| 7,193,365 B2 * | 3/2007 | Ishizaka | | 313/512 |
| 7,238,967 B2 * | 7/2007 | Kuwabara et al. | | 257/98 |
| 7,250,637 B2 * | 7/2007 | Shimizu et al. | | 257/98 |
| 2009/0003400 A1 * | 1/2009 | Nagahama et al. | | 372/50.23 |

FOREIGN PATENT DOCUMENTS

JP    2001-077408    3/2001

\* cited by examiner

*Primary Examiner*—Phuc T Dang
(74) *Attorney, Agent, or Firm*—Browdy and Neimark, PLLC

(57) ABSTRACT

A through-hole extending from an element-mounting surface to a back surface of a substrate is formed along an edge area of a bottom surface of the substrate. This through-hole is filled with a conductive resin paste directly into a quarter through-hole made in the substrate. This makes the conductive resin paste firmly adhere to the substrate preventing the conductive resin paste from being peeling off from the quarter through-hole even if the through-hole is reduced in diameter or has a cross-sectional configuration.

9 Claims, 7 Drawing Sheets

LIGHT-EMITTING DIODE

CROSS REFERENCE TO RELATED APPLICATION

The application is based on and claims the priority benefit of Japanese Patent Application No. 2008-36198, filed on Feb. 18, 2008 the entire description of which is incorporated herein by reference.

BACKGROUND OF THE INVENTION

1. Field of the Invention

The present invention relates to light-emitting diodes, and in particular, to the structure of electrodes intended for surface mounting of a light-emitting diode which is surface mounted on a circuit board such as a motherboard of an electronic device and emits light sideways.

2. Description of the Related Art

There is a conventional light-emitting diode including a substrate and a light-emitting diode element mounted on the substrate. When the light-emitting diode is soldered to a circuit board or a motherboard of various electronic devices, electrodes electrically connected from the surface where the light-emitting diode element is mounted may be used as soldering terminals. It is known that the light-emitting diode uses through-holes as soldering terminals, even if the light-emitting diode is soldered on the circuit board to emit light in a direction parallel to the surface of the circuit board or the motherboard (for example, see Japanese Patent Application Laid-Open No. 2001-77408).

FIG. 13 shows a cross section of a module that includes a conventional light-emitting diode element that emits light sideways. In this module, the light-emitting diode element 4 is mounted on a substrate 2. Through-holes 10 intended for mounting onto a wiring pattern 8 on a circuit board 6 are formed in the substrate 2. These through-holes 10 are plated to form conductor layers 12 on the inner peripheries, and are filled with solder 14 so that the conductor layers 12 will not produce burrs when cut.

To form the through-holes 10, bores are made in a substrate assembly. The inner peripheries of the bores are plated, and the openings are closed with a resist before the molding of a light-transmitting resin 16. The bores are filled with solder before being cut in the axial direction into a generally semi-cylindrical shape.

The foregoing module of side emission type typically has at least two through-holes 10 in the mounting surface, so as to be electrically continuous with a respective pair of electrodes on the substrate 2 to which the light-emitting diode element 4 is die-bonded and wire-bonded. In order to form the at least two semi-cylindrical through-holes 10 in an identical surface like this, the substrate 2 must have a mounting surface of sufficient size in which to form the plurality of through-holes 10. This has been a hindrance to miniaturization.

Consequently, it has conventionally been attempted to reduce the through-holes 10 in diameter, which has been proved to be difficult in terms of manufacturing. More specifically, in the foregoing conventional module, it has been necessary to close the openings with a resist or a dry film (hereinafter, collectively referred to as a resist) so as to prevent the light-transmitting resin 16 from flowing into the through-holes 10 when sealing the light-emitting element with the resin. Since this resist is intended to close the openings of the through-holes 10, it requires an external dimension greater than the diameter of the through-holes 10. There has also been the problem that the resist can be greatly misaligned from the through-holes 10 when formed on the substrate 2. In view of the diameter and misalignment of the resist, it has been impossible to close the through-holes 10 with reliability unless the resist is formed considerably larger than the diameter of the through-holes 10. The provision of the space for forming the resist increases a dead space on the substrate 2 and results in a great hindrance to miniaturization even if the through-holes 10 are reduced in diameter.

Conductive parts of the substrate 2 may be plated with silver for improved light reflection efficiency. Since the resist and silver have poor adhesion to each other, it is necessary in this case to close the through-holes with the resist before the silver plating of the conductive parts, so as to prevent exfoliation of the resist. Closing the through-holes at one side with the resist in advance, however, makes it harder for the plating solution to get into the through-holes. This requires that the through-holes be increased in diameter so that the through-holes are plated satisfactorily inside. There has thus been the problem of even greater dead space and more difficult miniaturization, when combined with the foregoing space for forming the resist.

Consequently, an attempt has been made to form the through-holes along edges of the mounting surface of the substrate 2, with a sector-shaped cross section derived by cutting a circle into about a quarter. This decreases the contact areas between the substrate and the conductor layers which cover the inner peripheries, however, as compared to the through-holes that have a generally semi-circular cross section. As a result, the conductor layers covering the inner peripheries can sometimes exfoliate from the substrate along with the filled solder and the like.

SUMMARY OF THE INVENTION

An object of the present invention is to provide a light-emitting diode in which smaller through-holes can be formed to facilitate miniaturization.

To achieve the foregoing object, a light-emitting diode according to one embodiment of the present invention includes: a substrate having a top surface, a bottom surface, and peripheral side surfaces therebetween; an electrode formed on an element-mounting surface which is one of the peripheral side surfaces of the substrate; and a light-emitting diode element mounted on the element-mounting surface and electrically connected to the electrode. The substrate has a through-hole extending from a corner adjoining the element-mounting surface and the bottom surface to a corner adjoining a back surface and the bottom surface of the substrate, the back surface being opposite to the element-mounting surface. This through-hole is filled with a conductive resin paste so that this conductive resin paste is flush with each of the element-mounting surface, the back surface, and the bottom surface.

Since the light-emitting diode has such a configuration, the conductive resin paste can firmly adhere to the substrate. The conductive resin paste therefore will not exfoliate from the through-hole of the substrate even if the through-hole is made smaller in diameter or cross-sectional configuration. This makes it possible to reduce the substrate in size, facilitating the miniaturization of the light-emitting diode.

DETAILED DESCRIPTION OF THE PREFERRED EMBODIMENT

Hereinafter, embodiments of the present invention will be described in detail with reference to the accompanying drawings.

Figure 1:
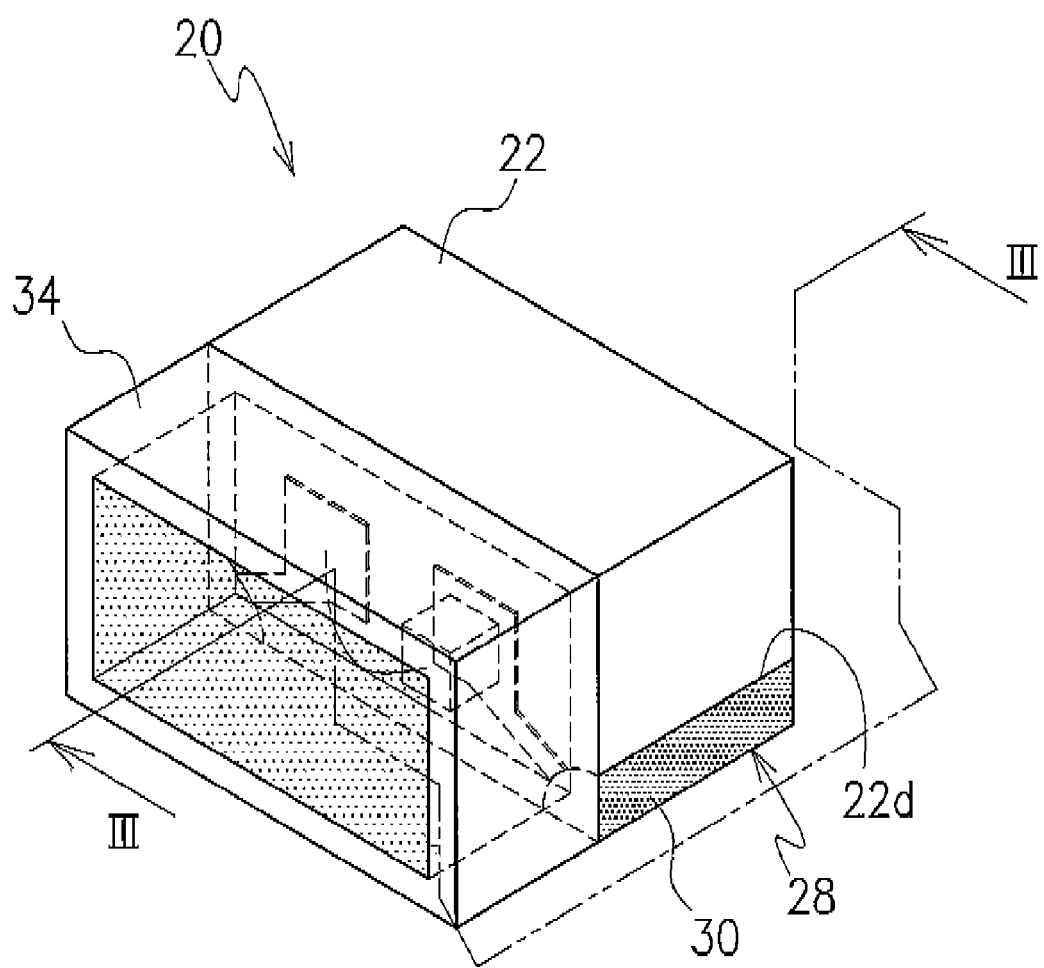
FIG. 1 is a perspective front view of a light-emitting diode according to an embodiment of the present invention.
Figure 2:
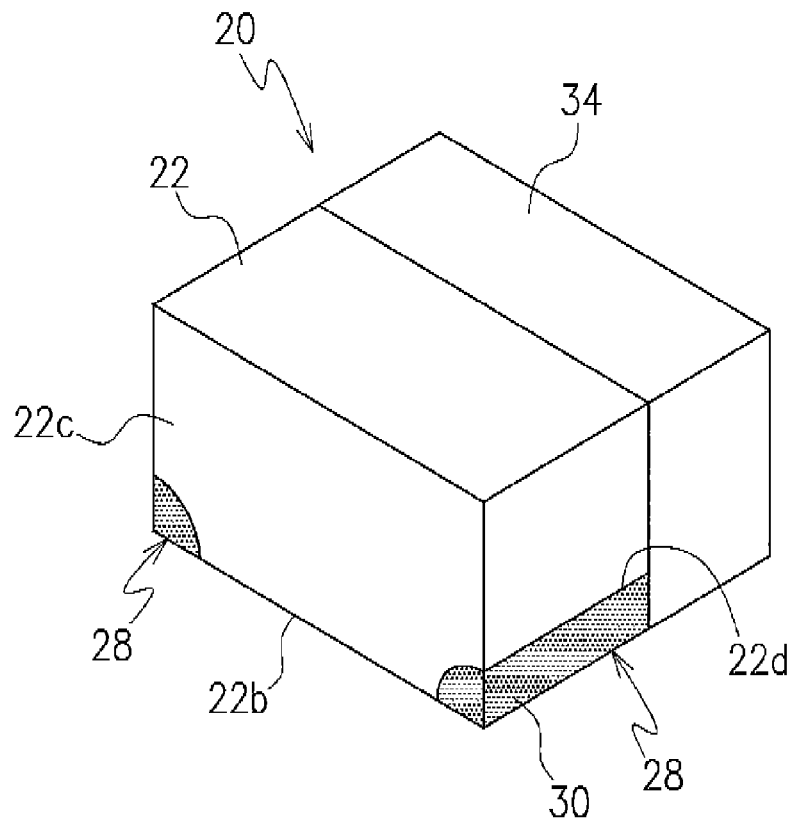
FIG. 2 is a perspective rear view of the light-emitting diode shown in FIG. 1.
Figure 3:
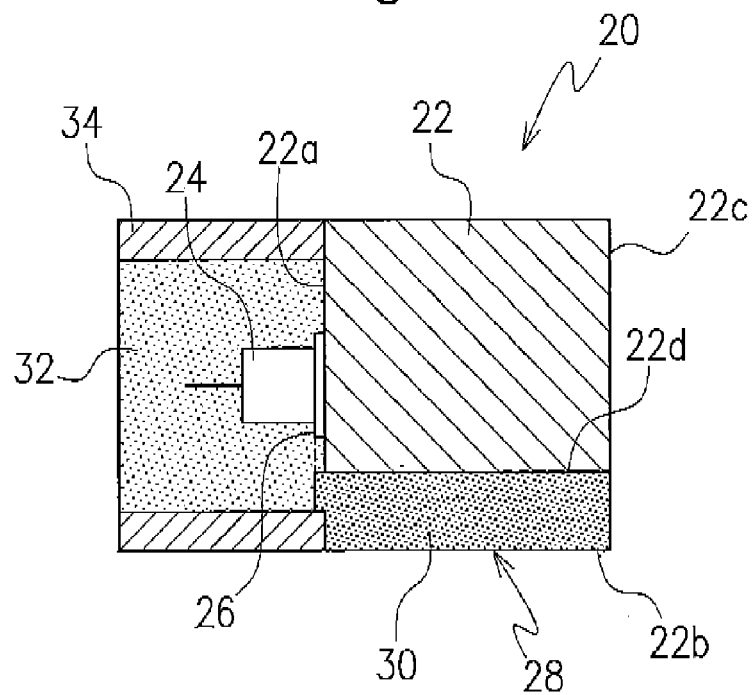
FIG. 3 is a sectional view of the light-emitting diode taken along line III-III of FIG. 1.

FIGS. 1 to 3 show a light-emitting diode 20 according to a first embodiment of the present invention. This light-emitting diode 20 is intended to emit light sideways, and includes a substrate 22, electrodes 26, a light-emitting diode element 24, a light-transmitting resin body 32, and a reflector 34. The substrate 22 has a top surface, a bottom surface, and peripheral side surfaces therebetween. The electrodes 26 are formed on an element-mounting surface 22a which is one of the peripheral side surfaces of the substrate 22. The light-emitting diode element 24 is mounted on one of the electrodes 26. The resin body 32 seals the light-emitting diode element 24. The reflector 34 is arranged around the resin body 32 for the sake of improved light reflection efficiency.

The bottom surface 22b of the substrate 22 is a mounting surface to be mounted on a circuit board or a motherboard. Through-holes 28 are formed in edge areas of this bottom surface 22b and the through-holes extend from the element-mounting surface 22a to an opposite surface that is one of the peripheral side surfaces, i.e., a back surface 22c of the substrate 22. That is, these through-holes 28 are formed in the portions that extend from the corners adjoining the element-mounting surface 22a and the bottom surface 22b of the substrate 22 to the corners adjoining the back surface 22c and the bottom surface 22b of the substrate 22. The through-holes 28 are filled with a conductive resin paste 30 such as a silver paste. This conductive resin paste 30 is made flush with each of the element-mounting surface 22a, the back surface 22c, and the bottom surface 22b of the substrate 22, i.e., so as to form a conductive-resin-paste filled through-holes.

The filled through-holes 28 of this embodiment are formed as filled quarter through-holes 22d, each having a quarter cylindrical shape or a quarter sector in section. The quarter cylindrical shape is derived from cutting a substrate assembly crosswise at a conductive-resin-paste-filled cylindrical through-hole. The substrate 22 exposes inner peripheries in the through-holes 22d, and the conductive resin paste 30 is directly filled into the through-holes 22d of the substrate 22.

In the light-emitting diode 20 of the foregoing configuration, the filled through-holes 28 are extremely small, having substantially a quarter-cylindrical shape. The areas of the conductive resin paste are relatively small, however in the present embodiment, since the conductive resin paste 30 is directly fixed to inner peripheries of the quarter through-holes 22d, the adhesion between the conductive resin paste 30 and the inner peripheries.

More specifically, the substrate 22 and the conductive resin paste 30 both contain resin, and the fact that they contain the same type of material enhances the bonding force for firm adhesion. Suppose that the inner peripheries of the quarter through-holes 22d are plated to form a metal layer, and into which the conductive resin paste 30 is filled. It then follows that the metal layer containing no resin is interposed between the substrate 22 and the conductive resin paste 30. This metal layer can sometimes exfoliate from the quarter through-holes 22d of small contact area due to its weak adhesion to the substrate 22 and the conductive resin paste 30. In contrast, according to this embodiment, the substrate 22 and the conductive resin paste 30 each containing the same material (resin) are put into direct contact for firm adhesion, and thus will not exfoliate despite the small contact areas therebetween.

Figure 4:
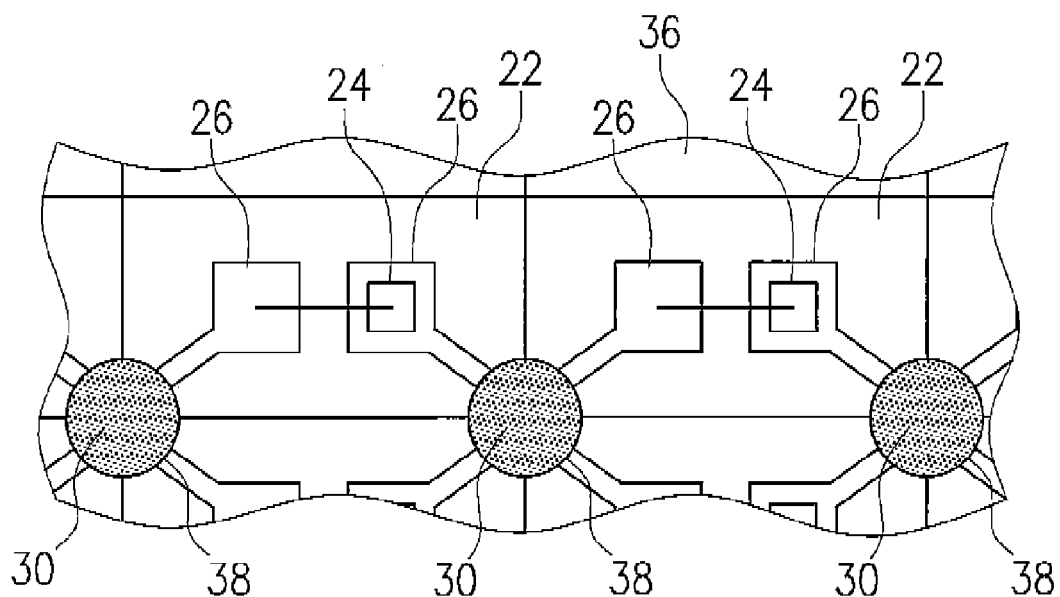
FIG. 4 is a plan view of a substrate assembly which provides an overview of a step of forming through-holes.
Figure 5:
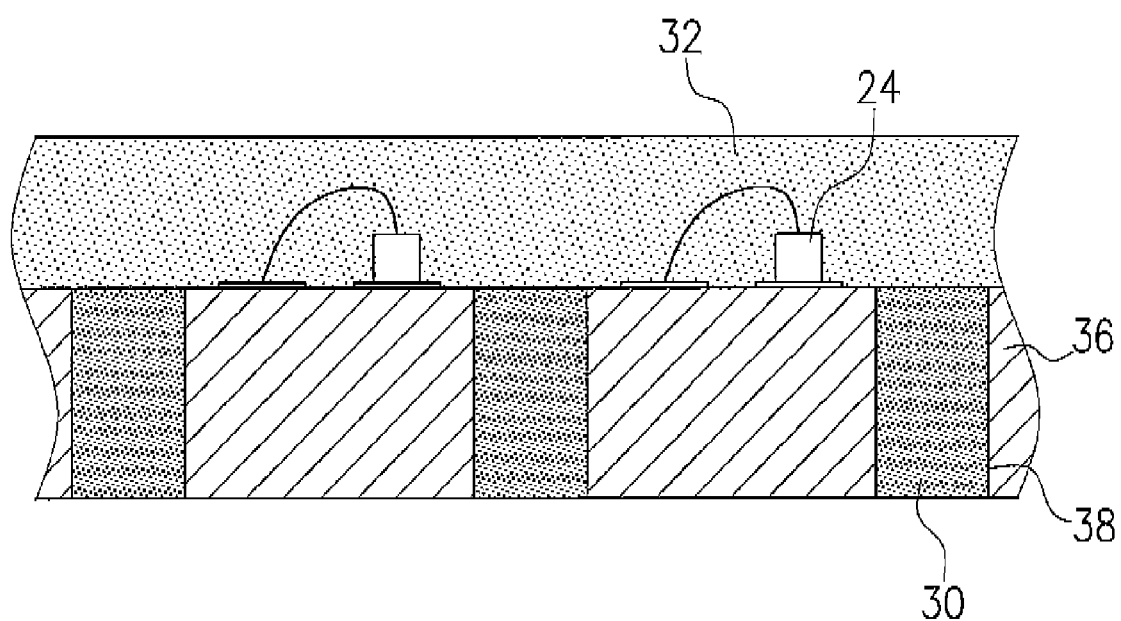
FIG. 5 is a sectional view of the substrate assembly when sealed with a light-transmitting resin.

FIGS. 4 and 5 show a substrate assembly 36, which provides an overview of the steps of forming the through-holes 28, reflector 34, and the like of the foregoing light-emitting diode 20. This substrate assembly 36 is capable of multiple formation of the light emitting diode 20 shown in FIG. 1. Initially, cylindrical bores 38 having no metal layer inside are formed in the edge areas of the substrates 22 of the respective light-emitting diodes 20.

Next, electrodes 26 electrically connected to light-emitting diode elements 24 are formed on the surface of the substrate assembly 36 by printing of a conductive resin paste. The bores 38 are also filled with the conductive resin paste 30. Subsequently, as shown in FIG. 5, the light-emitting diode elements 24 are die-bonded and wire-bonded to the electrodes 26 for mounting, and are collectively sealed with the resin body 32. Here, the bores 38 are filled and closed with the conductive resin paste 30 in advance. This prevents a drip of the sealing resin in the bores without a sealing resist or dry film.

Next, the substrate assembly 36 is diced through the centers of the bores 38 and separated into individual light-emitting diodes 20. Here, each bore 38 is split into four along the axial direction, and filled through-holes 28 having a quarter cylindrical shape. Note that reflectors 34 may be formed before separation if necessary.

The through-holes 28 filled with the conductive resin paste 30 as in the present embodiment are preferably bonded to a circuit board or a motherboard by using a conductive resin paste such as a silver paste, not by soldering, since the conductive resin paste 30 has poor solderability. Alternatively, the through-holes 28 may be plated with gold, tin or other metal at the surface thereof so that the conductive resin paste 30 is covered with the metal layer. This makes it possible to use soldering for adhesion.

FIGS. 6 to 12 show light-emitting diodes 20 with quarter filled through-holes 28 in section. Each of the shown light-emitting diodes 20 not only has the electrodes 26 on the element-mounting surface 22a of the substrate 22 but electrodes 27 on the back surface 22c of the substrate 22 as well. The light-emitting diodes 20 show various examples of structures of the portion where these electrodes 26 and 27 and the ends of the through-holes 28 are connected. In the present embodiment, the structure shown in FIG. 6 shall be the basic structure. FIGS. 7 to 12 show structures by which the conductive resin paste 30 can be joined more firmly to the inner peripheries of the quarter through-holes 22d of the substrate 22.

For the sake of convenience, the following description will only deal with either one of the two through-holes 28 (22d) and its corresponding electrodes 26 and 27. The same description will apply to the other through-hole 28 (22d) and its corresponding electrodes 26 and 27.

Figure 6:
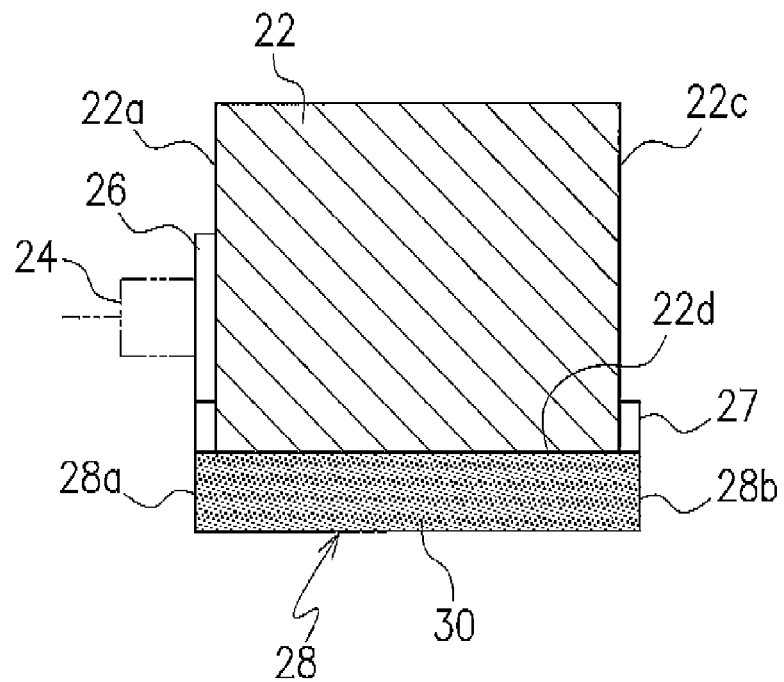
FIG. 6 is a partial enlarged sectional view of a through-hole shown in FIG. 1, cut in the axial direction of the through-hole.

FIG. 6 shows a structure in which the electrodes 26 and 27 formed on the element-mounting surface 22a and the back surface 22c of the substrate 22 of the light-emitting diode 20 do not overlap the respective ends 28a and 28b of the filled through-hole 28 at the element-mounting surface 22a and the back surface 22c. Consequently, the ends 28a and 28b of the filled through-hole 28 are not closed by the electrode. This structure provides firm adhesion by the bonding force between the inner periphery of the quarter through-hole 22d and the conductive resin paste 30.

Figure 7:
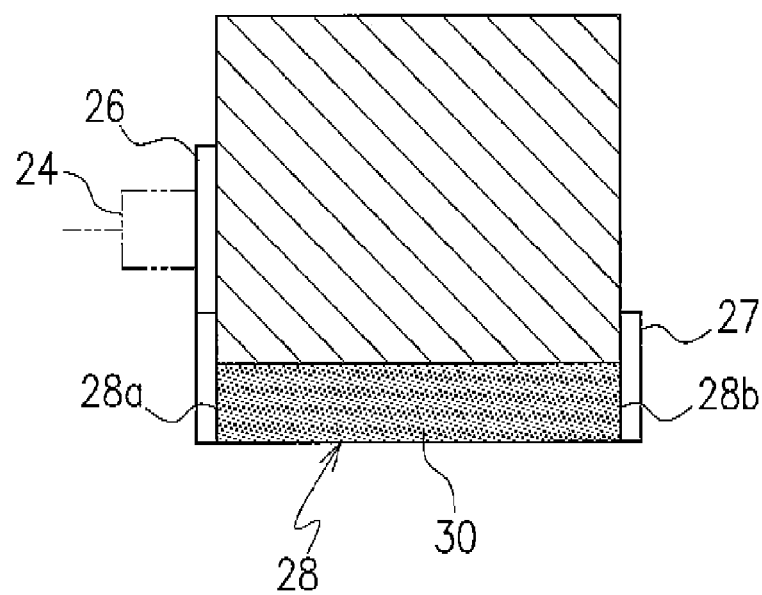
FIG. 7 is a partial enlarged sectional view showing a modification of the physical relationship between the ends of the through-hole and the electrodes shown in FIG. 6.

FIG. 7 shows a structure in which the electrodes 26 and 27 overlap the respective ends 28a and 28b of the filled through-hole 28 so as to close the ends 28a and 28b of the through-hole 28. This structure can provide a fixing force for holding the end faces of the conductive resin paste 30 with the electrodes 26 and 27, in addition to the foregoing bonding force resulting from the contact between the inner periphery of the quarter through-hole 22d and the conductive resin paste 30. This can enhance the adhesion of the conductive resin paste 30.

Figure 8:
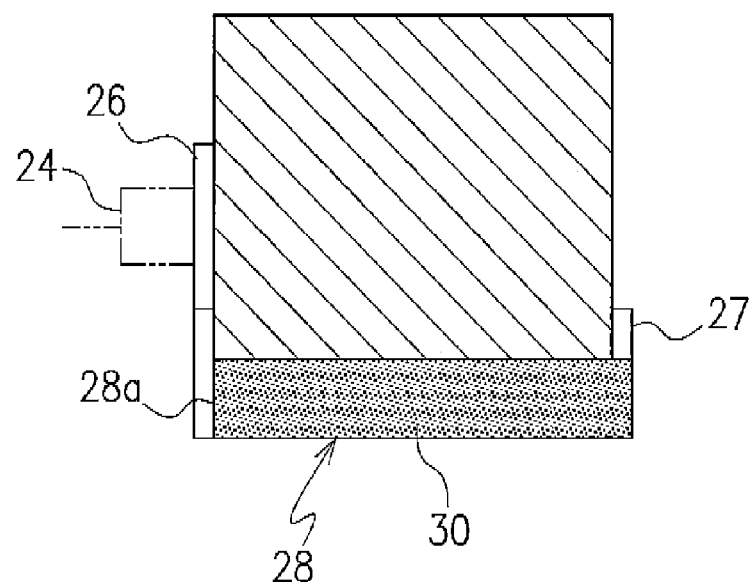
FIG. 8 is a partial enlarged sectional view showing a further modification of the physical relationship between the ends of the through-hole and the electrodes shown in FIG. 6.

FIG. 8 shows a structure in which either one of the electrodes 26 and 27 (the electrode 26, in FIG. 8) is extended over the end 28a of the filled through-hole 28 so as to close the end 28a of the through-hole 28. This structure can also provide an additional fixing force to hold one of the end faces of the conductive resin paste 30 for enhanced adhesion.

Figure 9:
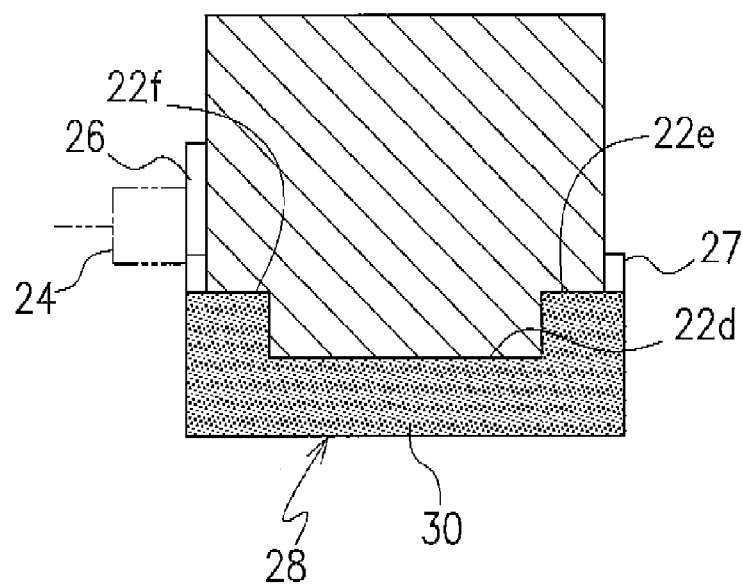
FIG. 9 is a partial enlarged sectional view showing another embodiment where step portions are formed in the vicinities of both ends of the through-hole shown in FIG. 6.
Figure 10:
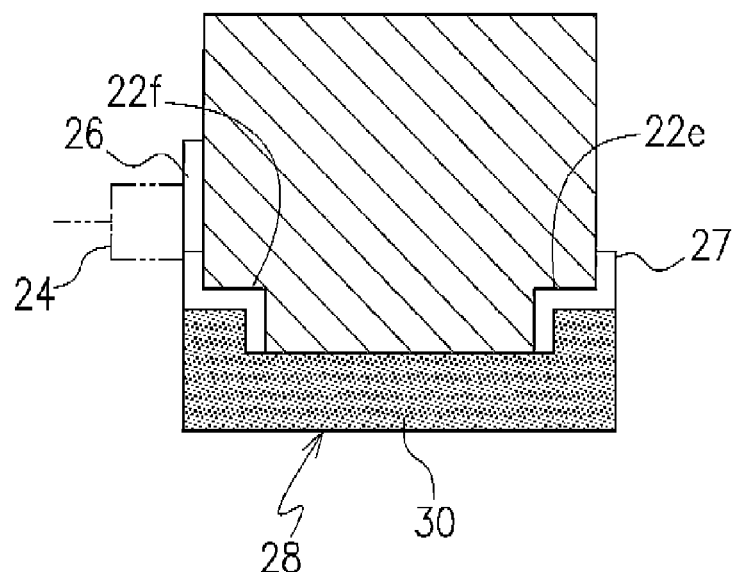
FIG. 10 is a partial enlarged sectional view showing an embodiment where the electrodes are extended into the step portions of the through-hole shown in FIG. 9.

FIG. 9 shows a structure in which step portions 22e and 22f are formed in the vicinities of both ends of the quarter filled through-hole 22d so as to increase the end-area diameter. These step portions 22e and 22f are also filled with the conductive resin paste 30. In this structure, the conductive resin paste 30 is fixed in contact with the step portions 22e and 22f, and thus more areas of the conductive resin paste 30 adhere to the inner periphery of the quarter through-hole 22d more firmly. This structure may be modified as shown in FIG. 10, where the electrodes 26 and 27 are formed in the step portions 22e and 22f. This maintains the structure that the conductive resin paste 30 filled in the step portions 22e and 22f is caught in the step portions 22e and 22f, and thus, achieving firm adhesion as well.

Figure 11:
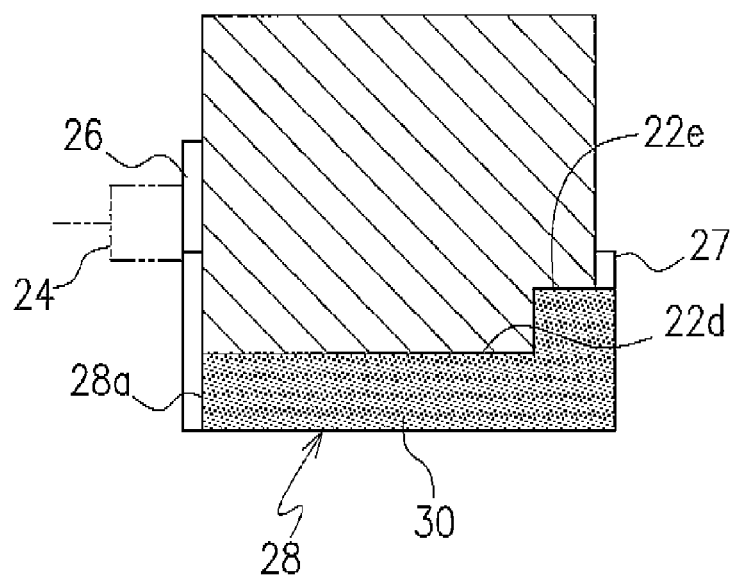
FIG. 11 is a partial enlarged sectional view showing the relationship with the electrodes when a step portion is formed in the vicinity of one of the ends of the through-hole shown in FIG. 6.
Figure 12:
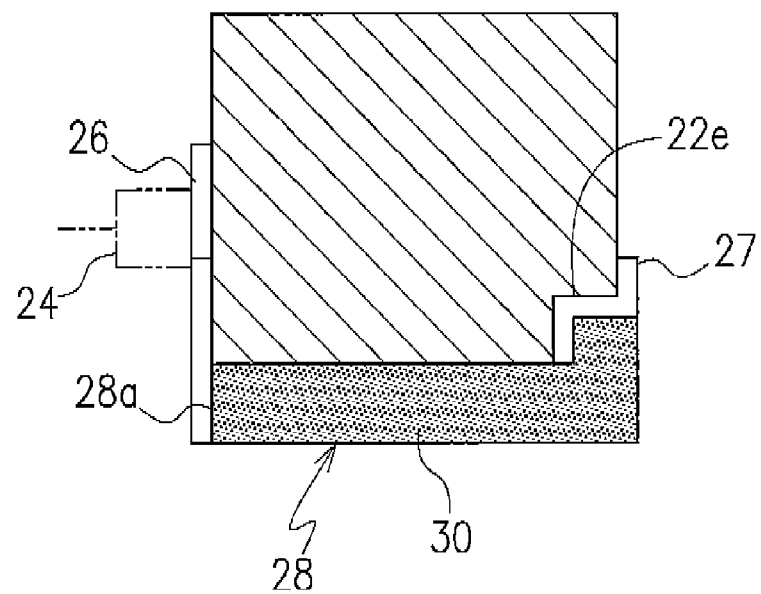
FIG. 12 is a partial enlarged sectional view showing an embodiment where an electrode is extended into the step portion of the through-hole shown in FIG. 11.
Figure 13:
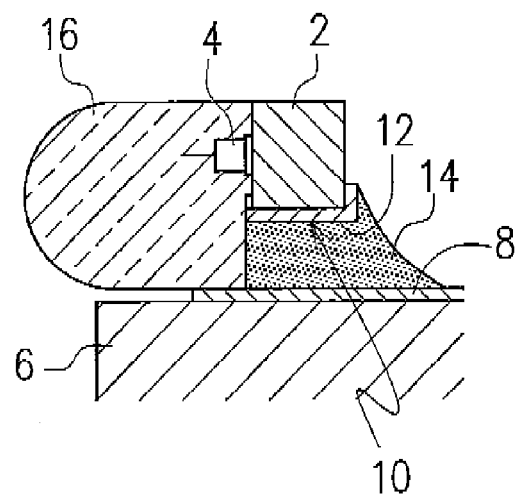
FIG. 13 is a sectional view showing an example of a conventional module for emitting light sideways.

FIG. 11 shows a structure in which a step portion 22e is formed in one of the ends of the quarter through-hole 22d, and the conductive resin paste 30 is filled into the same. The electrode 26 is extended over the other end 28a of the through-hole 28 so as to close that end. With this structure, the both sides of the conductive resin paste 30 can be caught in and held by the step portion 22e and the electrode 26, which allows firm adhesion. This structure may be modified as shown in FIG. 12, where the electrode 27 is formed in the step portion 22e. This also allows firm adhesion as with the structure of FIG. 11.

It should be appreciated that the structures according to the present embodiment are best suited to a case of side mounting where the light is emitted generally in parallel with the mounting surface, i.e., the bottom surface of the substrate, and the light-emitting diode has quarter through-holes at two corners. Nevertheless, the adhesion of the conductive resin paste can also be enhanced even when the structures are used for ordinary surface mounting other than side mounting or with half through-holes.

According to the light-emitting diode of the present invention, the through-holes are filled with a conductive resin paste directly into bores and cutting them in the axial direction of the through-holes. With the through-holes of this configuration, the resin adhesive contained in the conductive resin paste adheres to the resin substrate in a favorable state. This can bond the conductive resin paste to the substrate firmly, so that the conductive resin paste will not exfoliate from the through-holes of the substrate even if the through-holes are reduced in diameter or cross-sectional configuration. This makes it possible to reduce the substrate in size, facilitating the miniaturization of the light-emitting diode.

Since the through-holes are formed by filling the conductive resin paste directly into the bores of the substrate, the bores need not be closed with a resist or dry film. This eliminates the need to provide a space for forming the resist or the like on the substrate as in the conventional techniques, and thus, facilitating miniaturization further.

Although the preferred embodiments of the present invention have been described, it should be noted that the present invention is not limited to these embodiments, various changes and modifications can be made to the embodiments, and the changes and the modifications can be included in the scope of the present invention.

What is claimed is:

1. A light-emitting diode comprising:
    a substrate having a top surface, a bottom surface, and peripheral side surfaces therebetween;
    a pair of electrodes formed on an element-mounting surface which is one of the peripheral side surfaces of the substrate; and
    a light-emitting diode element mounted on the element-mounting surface and electrically connected to the electrode,
    the substrate having a pair of through-holes each extending from a corner adjoining the element-mounting surface and the bottom surface to a corner adjoining a back surface and the bottom surface of the substrate, the back surface being opposite to the element-mounting surface, and
    the through-hole being filled with a conductive resin paste and the conductive resin paste being flush with each of the element-mounting surface, the back surface, and the bottom surface.

2. The light-emitting diode according to claim 1, wherein the filled through-hole has a quarter cylindrical shape.

3. The light-emitting diode according to claim 1, wherein a metal plating layer is formed on a surface of the through-hole.

4. The light-emitting diode according to claim 1, wherein the electrode is electrically connected to an end face of the filled through-hole at the element-mounting surface of the substrate.

5. The light-emitting diode according to claim 1, wherein at least an end of the through-holes at the element-mounting surface of the substrate is covered with the electrode.

6. The light-emitting diode according to claim 1, wherein a step portion is formed in the substrate at least in the vicinity of an end of at least one of the through-holes at the element-mounting surface of the substrate, the step portion is filled with the conductive resin paste.

7. The light-emitting diode according to claim 6, wherein the end has a greater area than other portion of the through-hole in section.

8. The light-emitting diode according to claim 1, wherein the electrode extends between the conductive resin paste and the substrate at the step portion.

9. The light-emitting diode according to claim 1, comprising a reflector for reflecting light in a direction of emission, the reflector being arranged on the element-mounting surface of the substrate and surrounding the light-emitting diode element.

* * * * *

UNITED STATES PATENT AND TRADEMARK OFFICE
CERTIFICATE OF CORRECTION

| | |
|---|---|
| PATENT NO. | : 7,791,083 B2 |
| APPLICATION NO. | : 12/372892 |
| DATED | : September 7, 2010 |
| INVENTOR(S) | : Kosuke Tsuchiya |

It is certified that error appears in the above-identified patent and that said Letters Patent is hereby corrected as shown below:

At claim 1, column 6, lines 40-41, delete "electrode" and insert --electrodes--;
At claim 1, column 6, line 48, delete "through-hole" and insert --through-holes--;
At claim 2, column 6, line 53, delete "the" and insert --each--;
At claim 3, column 6, line 55, delete "the" and insert --each--;
At claim 4, column 6, line 57, delete "the" (first occurrence) and insert --each--;
At claim 4, column 6, line 57, delete "the" second occurrence) and insert --each--;
At claim 8, column 7, line 4, delete "1" and insert --6--.

Signed and Sealed this
Fifteenth Day of November, 2011

David J. Kappos
*Director of the United States Patent and Trademark Office*